United States Patent
Mendel et al.

(10) Patent No.: US 9,312,883 B1
(45) Date of Patent: Apr. 12, 2016

(54) HIERARCHICAL CYCLIC REDUNDANCY CHECK CIRCUITRY

(71) Applicant: Altera Corporation, San Jose, CA (US)

(72) Inventors: David W. Mendel, Sunnyvale, CA (US); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 178 days.

(21) Appl. No.: 13/742,192

(22) Filed: Jan. 15, 2013

(51) Int. Cl.
*H03M 13/09* (2006.01)
*G06F 11/10* (2006.01)

(52) U.S. Cl.
CPC .......... *H03M 13/091* (2013.01); *H03M 13/093* (2013.01); *G06F 11/1004* (2013.01); *H03M 13/09* (2013.01)

(58) Field of Classification Search
CPC . H03M 13/091; H03M 13/09; H03M 13/093; H03M 13/15; H03M 13/05; G06F 11/1004
USPC ................... 714/807, 808, 801, 758
See application file for complete search history.

(56) References Cited

U.S. PATENT DOCUMENTS

| | | | |
|---|---|---|---|
| 6,609,225 B1 | 8/2003 | Ng | |
| 7,103,832 B2 | 9/2006 | Leonard et al. | |
| 7,328,396 B2 * | 2/2008 | Mann | 714/781 |
| 8,037,399 B2 | 10/2011 | Wong et al. | |
| 2008/0244361 A1* | 10/2008 | Walma | 714/758 |
| 2009/0164865 A1* | 6/2009 | Leonard et al. | 714/755 |

\* cited by examiner

*Primary Examiner* — Albert Decady
*Assistant Examiner* — Christian Dorman

(57) ABSTRACT

Cyclic redundancy check (CRC) circuitry of a given input data path width is provided to perform CRC on data packets with fixed/variable word length where either the start of packet or the end of packet or both don't need to be aligned with the last and first word or bit of the CRC circuitry's input data path. The CRC circuitry is organized in a hierarchical configuration. A first level performs partial cyclic redundancy checks which are then combined in a second level to perform the cyclic redundancy check from all received data words or bits independent of the start of packet and end of packet positions. The hierarchical configuration enables the increase of the input data path width without incurring the significant increase in area observed for conventional CRC circuitry. This also decreases the number and length of interconnects compared to conventional CRC circuitry, and thus facilitates timing closure.

22 Claims, 7 Drawing Sheets

HIERARCHICAL CYCLIC REDUNDANCY CHECK CIRCUITRY

BACKGROUND

This invention relates to integrated circuits and more particularly to integrated circuits with cyclic redundancy check circuitry.

Many integrated circuits use cyclic redundancy check (CRC) circuitry for error checking in data storage and transmission applications. A cyclic redundancy check is performed by a polynomial division of user data by a pre-defined divisor. The remainder of the polynomial division, a so-called check value, is attached to the data before transmission or storage. Upon retrieval or reception of the data, the polynomial division is repeated and the resulting calculated remainder is compared to the check value. Mismatches in the comparison are indicative of data corruption.

A cyclic redundancy check (CRC) is usually performed for each data packet. A data packet consists of multiple bits or words. The start of packet starts a CRC calculation and the end of packet stops a CRC calculation. Cyclic redundancy check (CRC) circuitry typically has a fixed input data path width, (i.e. it can receive a fixed number of bits or words and perform an incremental cyclic redundancy check on the received bits or words at a time and then moves to the next increment of data for more incremental CRC computation). Therefore, the start of a data packet or the end of a data packet or both may not be aligned with the last and first word or bit of the CRC circuitry's input data path.

Conventional CRC circuitry has addressed this problem by pre-computing the contribution of each data word or bit to the CRC result as though that word or bit was 1, 2, 3, . . . n words or bits from the end of packet and performing a logic exclusive OR operation on all pre-computed contributions at the position of the end of packet. This approach is problematic because the size of the CRC circuitry quadruples whenever the data path width is doubled.

SUMMARY

In accordance with certain aspects of the invention, circuitry that performs a cyclic redundancy check on a data packet, where the data packet is bounded by a start of packet and an end of packet, may include multiple first and second circuits. Each first circuit may receive at least a portion of the data packet and may compute a partial result by performing a cyclic redundancy check on the portion of the data packet that it receives. All of the first circuits may process different portions of the data packet and may therefore process those different portions of the data packet in parallel. The second circuits may combine the partial results from the first circuits to determine the cyclic redundancy check of the data packet.

It is appreciated that the present invention can be implemented in numerous ways, such as a process, an apparatus, a system, a device, or a method on a computer readable medium. Several inventive embodiments of the present invention are described below.

If desired, the above mentioned circuitry may further include pipeline registers between the first and second circuits. The above mentioned circuitry may also include multiplexers to select outputs from the first and second circuits based on the start of packet.

Further features of the invention, its nature and various advantages, will be more apparent from the accompanying drawings and the following detailed description of the preferred embodiments.

DETAILED DESCRIPTION

The embodiments provided herein relate to integrated circuits with cyclic redundancy check (CRC) circuitry.

A cyclic redundancy check is performed by a polynomial division of user data by a pre-defined divisor. The remainder of the polynomial division, a so-called check value, is attached to the data before transmission or storage. On retrieval or reception of the data, the polynomial division is repeated and the thereby calculated remainder is compared to the check value. A cyclic redundancy check (CRC) is performed for each data packet. A cyclic redundancy check (CRC) circuitry that performs cyclic redundancy checks typically has a fixed input data path width, (i.e. it can receive a fixed number of words and perform a cyclic redundancy check on the received words in parallel). The problem of receiving the start of packet and the end of packet at different input locations of the CRC circuitry is typically solved by pre-computing the contribution of each data word to the CRC result as though that word was 1, 2, 3, . . . n words from the end of packet and performing a logic exclusive OR operation on all pre-computed contributions.

This approach is problematic because the size of the CRC circuitry quadruples whenever the data path width is doubled. This leads to a significant increase in size and thus cost when building CRC circuitry for upcoming communication protocols such as for example 300G Interlaken or Terabit Ethernet. It also leads to a significant increase in interconnection resources which contributes to the increase in size. Furthermore, the increase in interconnection resources has the undesirable side effect that the length of combinational paths within the CRC circuitry increases significantly, which potentially leads to timing closure problems and thereby to an increase in development time.

It would therefore be desirable to develop more efficient CRC circuitry, such as for example hierarchical CRC circuitry, especially for wider input data path widths.

It will be recognized by one skilled in the art, that the present exemplary embodiments may be practiced without some or all of these specific details. In other instances, well-known operations have not been described in detail in order not to unnecessarily obscure the present embodiments.

Figure 1:
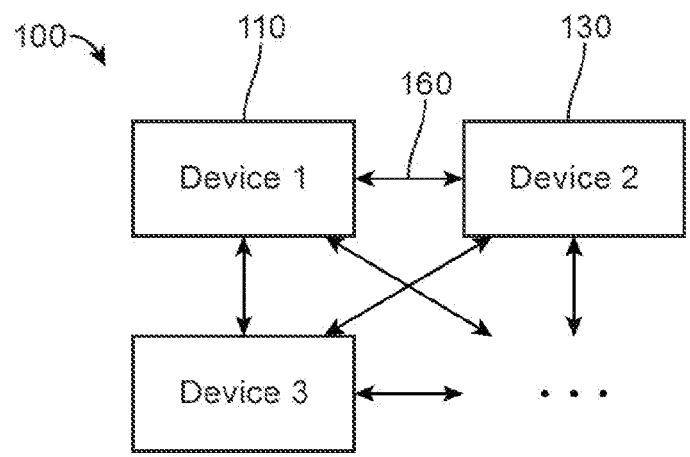
FIG. 1 is a diagram of an illustrative system of interconnected devices in accordance with an embodiment of the present invention.

An illustrative system of interconnected electronic devices 100 is shown in FIG. 1

The system of interconnected electronic devices has one or more electronic devices such as device 110 and device 130 and interconnection resources 160. The electronic devices may be any suitable type of electronic devices that is communicating with other electronic devices. Examples for such electronic devices include basic electronic components and circuits such as analog circuits, digital circuits, mixed-signal circuits, and integrated circuits that are interconnected on a printed-circuit board (PCB) or on different printed-circuit boards, which are interconnected using given types of interconnection circuitry such as fiber optic cables, metal cables, or a backplane, to name a few. Examples for such electronic devices also include complex electronic systems such as network routers and cell phone base stations or parts thereof that communicate with each other over wired or wireless networks. Interconnection resources 160 such as conductive lines and busses, optical interconnect infrastructure, or wired and wireless networks with optional intermediate switches may be used to send signals from one electronic device to another electronic device or to broadcast information from one electronic device to multiple other electronic devices.

Devices 110 and 130 may include CRC circuitry. For example, device 110 may be configured to transmit data over interconnection resources 160 to device 130. Device 110 may use the CRC circuitry to generate check values and attach these check values to the data before transmitting the data over interconnection resources 160 to device 130. Device 130 may perform a cyclic redundancy check on the data it receives over interconnection resources 160 and compare the result of this check to the check values attached to the data. A mismatch in the comparison may indicate that the data was corrupted during transmission.

Figure 2:
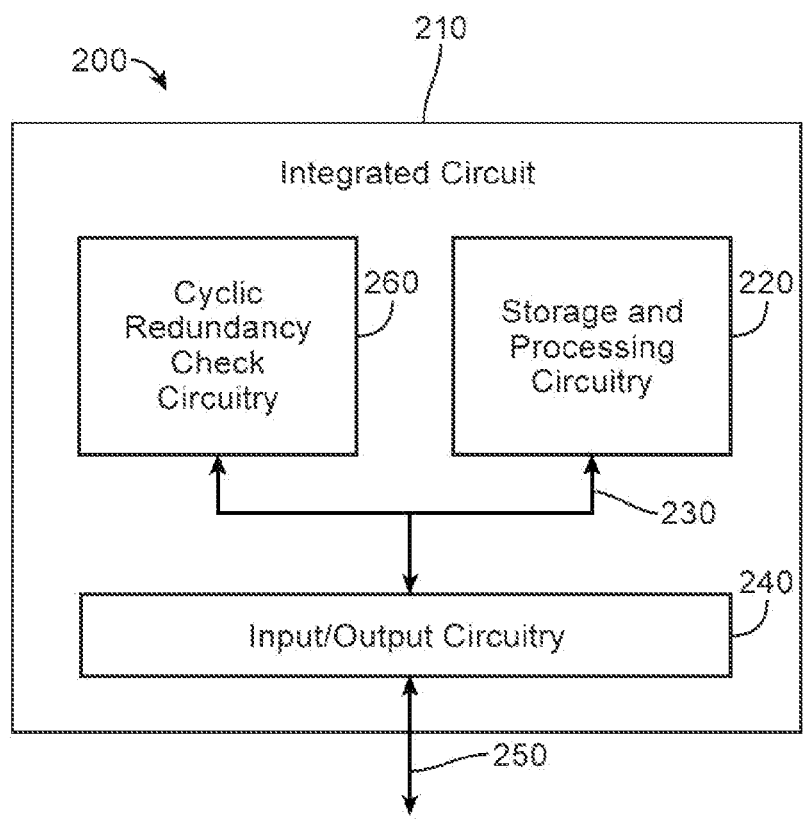
FIG. 2 is an illustrative diagram of an integrated circuit in accordance with an embodiment of the present invention.

An illustrative embodiment of an electronic device 200 such as an integrated circuit 210 in accordance with the present invention is shown in FIG. 2.

Integrated circuit 210 may have multiple components. These components may include storage and processing circuitry 220, cyclic redundancy check (CRC) circuitry 260, and input/output circuitry 240.

Storage and processing circuitry 220 may include embedded microprocessors, digital signal processors (DSP), microcontrollers, or other processing circuitry. The storage and processing circuitry 220 may further have random-access memory (RAM), first-in first-out (FIFO) circuitry, stack or last-in first-out (LIFO) circuitry, read-only memory (ROM), or other memory elements.

Input/output circuitry may include parallel input/output circuitry, differential input/output circuitry, serial data transceiver circuitry, or other input/output circuitry suitable to transmit and receive data.

Internal interconnection resources 230 such as conductive lines and busses may be used to send data from one component to another component or to broadcast data from one component to one or more other components. External interconnection resources 250 such as conductive lines and busses, optical interconnect infrastructure, or wired and wireless networks with optional intermediate switches may be used to communicate with other devices.

CRC circuitry 260 may be used to generate check values by performing a cyclic redundancy check on data packets. Check values may be generated for data packets before they are stored in storage and processing circuitry 220. Check values may also be generated before data packets are sent over internal interconnection resources 230, input/output circuitry 240, and external interconnection resources 250 to other electronic devices. CRC circuitry 260 may also be used to perform a cyclic redundancy check on data packets that are retrieved from storage and processing circuitry 220 or on data packets that are received from other electronic devices through external interconnection resources 250, input/output circuitry 240, and internal interconnections resources 230.

Figure 3:
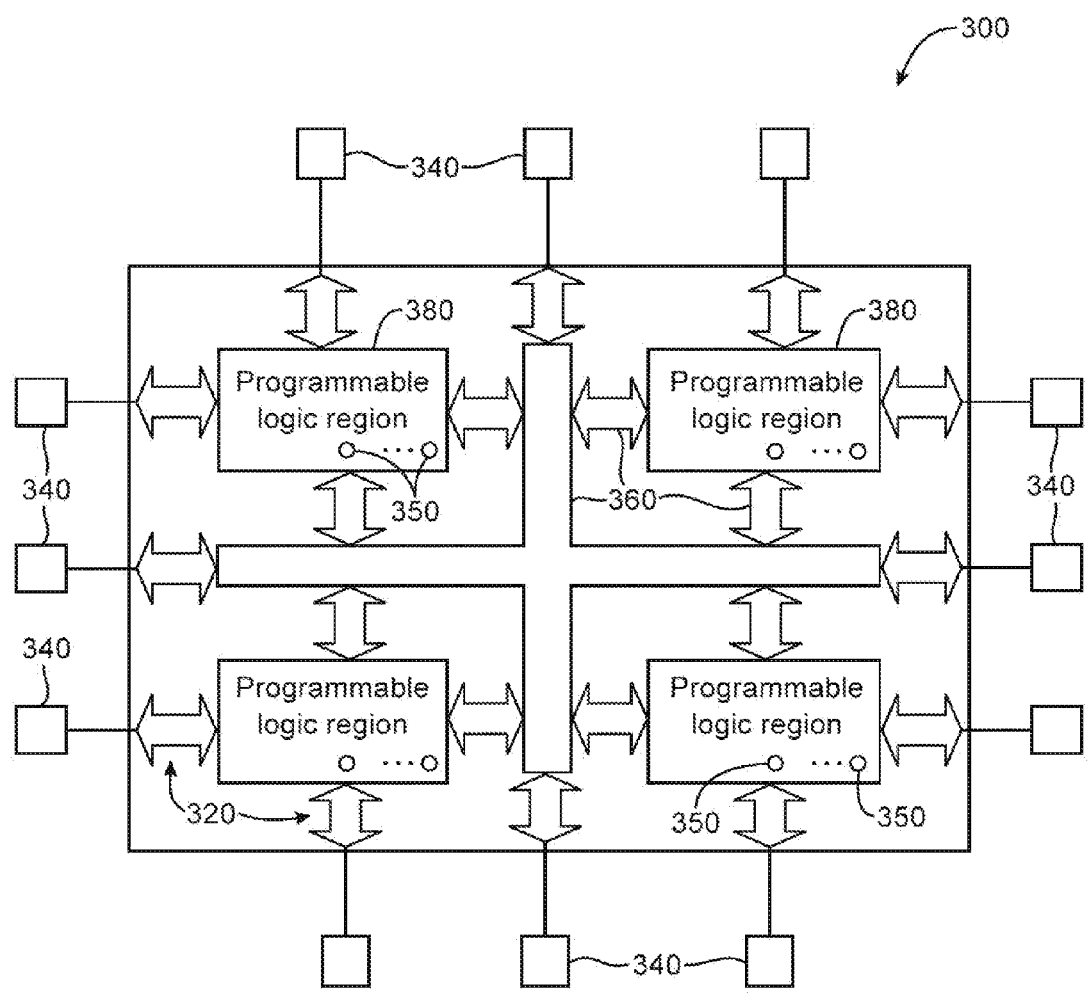
FIG. 3 is a diagram of an illustrative programmable integrated circuit such as a programmable logic device integrated circuit in accordance with an embodiment of the present invention.

An illustrative embodiment of an integrated circuit 210 such as a programmable logic device 300 in accordance with the present invention is shown in FIG. 3.

Programmable logic device 300 has input/output circuitry 320 for driving signals off of device 300 and for receiving signals from other devices via input/output pins 340. Interconnection resources 360 such as global and local vertical and horizontal conductive lines and buses may be used to route signals on device 300.

Input/output circuitry 320 include parallel input/output circuitry, serial data transceiver circuitry, differential receiver and transmitter circuitry, or other circuitry used to connect one integrated circuit to another integrated circuit.

Interconnection resources 360 include conductive lines and programmable connections between respective conductive lines and are therefore sometimes referred to as programmable interconnects 360.

Programmable logic region 380 may include programmable components such as digital signal processing circuitry, storage circuitry, arithmetic circuitry, programmable phase-locked loop circuitry, programmable delay-locked loop circuitry, or other combinational and sequential logic circuitry. The programmable logic region 380 may be configured to perform a custom logic function. For example, the programmable logic region 380 may be configured to implement cyclic redundancy check (CRC) circuitry. The programmable logic region 380 may also include hardened circuitry that performs a given application. The hardened circuitry may have some limited configurability. For example, the programmable logic region 380 may also include hardened n-word wide cyclic redundancy (CRC) circuitry. The programmable interconnects 360 may also be considered to be a type of programmable logic region 380.

Programmable logic device 300 contains programmable memory elements 350. Memory elements 350 can be loaded with configuration data (also called programming data) using pins 340 and input/output circuitry 320. Once loaded, the memory elements each provide a corresponding static control signal that controls the operation of an associated logic component in programmable logic 380. In a typical scenario, the outputs of the loaded memory elements 350 are applied to the gates of metal-oxide-semiconductor transistors in programmable logic 380 to turn certain transistors on or off and thereby configure the logic in programmable logic 380 and routing paths. Programmable logic circuit elements that may be controlled in this way include parts of multiplexers (e.g., multiplexers used for forming routing paths in programmable interconnects 360), look-up tables, logic arrays, AND, OR, NAND, and NOR logic gates, pass gates, etc.

Memory elements 350 may use any suitable volatile and/or non-volatile memory structures such as random-access-memory (RAM) cells, fuses, antifuses, programmable read-only-memory cells, mask-programmed and laser-programmed structures, combinations of these structures, etc. Because memory elements 350 are loaded with configuration data during programming, memory elements 350 are sometimes referred to as configuration memory, configuration RAM, or programmable memory elements.

The circuitry of device 300 may be organized using any suitable architecture. As an example, the logic of programmable logic device 300 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

During device programming, configuration data may be loaded into device 300 that configures the programmable logic regions 380 so that their logic resources perform desired logic functions.

For example, the programmable logic region 380 may be configured to implement cyclic redundancy check (CRC) circuitry. The programmable logic region 380 may also include hardened n-word wide cyclic redundancy (CRC) circuitry. CRC circuitry in programmable logic region 380 may be used to generate check values by performing a cyclic redundancy check on data packets. Check values may be generated for data packets before they are stored in storage circuitry in programmable logic region 380. Check values may also be generated for data packets before they are sent via input/output circuitry 320 and input/output pins 340 to other electronic devices or via interconnection resources 320 to other programmable logic regions 380. CRC circuitry in programmable logic region 380 may also be used to perform a cyclic redundancy check on data packets that are retrieved from storage circuitry in programmable logic region 380. CRC circuitry in programmable logic region 380 may further be used to perform a cyclic redundancy check on data packets that are received from other electronic devices via input/output pins 340 and input/output circuitry 320 or on data packets received from other programmable logic regions via interconnection resources 360.

Figure 4:
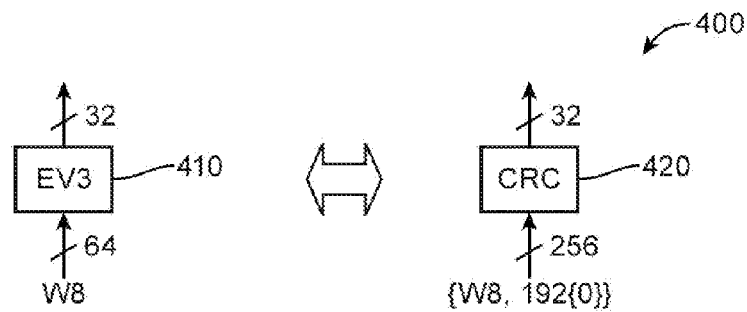
FIG. 4 is a diagram of an illustrative representation of a cyclic redundancy check padded with zeros in accordance with an embodiment of the present invention.

A cyclic redundancy check of a data packet having several words may be performed by pre-computing the contribution of each data word to the CRC result as though that word was one, two, three, . . . n words from the end of packet and performing a logic exclusive OR operation on all pre-computed contributions. FIG. 4 shows an example for pre-computing the contribution of a data word that is three words from the end of packet 400. Consider a scenario in which a data packet has four words each having 64 bits of data. The contribution of the 64-bit word at the start of packet position is considered to be three words away from the end of packet position. The contribution of the 64-bit word at the start of packet position to the CRC result may be pre-computed by concatenating three 64-bit words of zero (i.e. 192 bits of zeros) to the 64-bit word at the start of packet position and performing the cyclic redundancy check 420 on the resulting 256-bit word. In the example of FIG. 4, the polynomial is 33 bits wide and the resulting remainder is 32 bits wide. Performing a cyclic redundancy check using a 33-bit wide polynomial is sometimes also referred to as performing a 32-bit CRC operation or calculating a 32-bit CRC or computing a 32-bit CRC. Pre-computing the contribution of a 64-bit data word to a CRC result with the data word being three words from the end of packet is sometimes also referred to as computing the CRC of a data word "evolved" over three words (e.g., with 64 bits per word) or as computing the third evolution of the word. Computing the third evolution of a 64-bit word is depicted as operation EV3 410 in FIG. 4 and takes a 64 bit word, concatenates 192-bits of zero to it, and computes a 32-bit CRC of the resulting 256-bit word.

Figure 5:
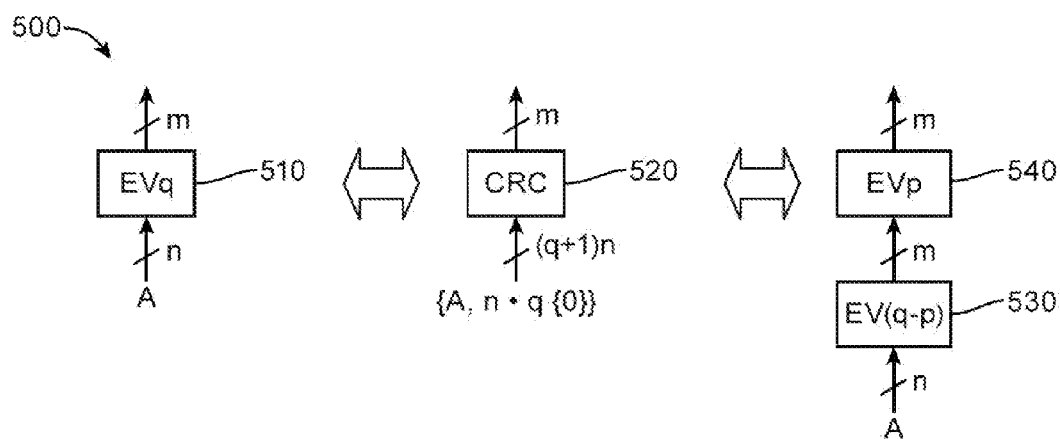
FIG. 5 is a diagram of an illustrative decomposition of a cyclic redundancy check padded with zeroes in accordance with an embodiment of the present invention.

FIG. 5 generalizes the concept of pre-computing the contribution of an n-bit data word A to a CRC result as though that word was at a distance of q-words from the end of packet. The n bits of word A are concatenated with n*q bits of zero. An m-bit CRC computation 520 is performed on the resulting (q+1)*n bits. This is sometimes also referred to as computing the m-bit CRC of data word A evolved over q words, n bits per word, or as computing the q-th evolution of word A, depicted as operation EVq 510 in FIG. 5. This is also equivalent to first computing the (q−p)-th evolution 530 of word A followed by the p-th evolution 540 of the result with p smaller than or equal to q.

Figure 6:
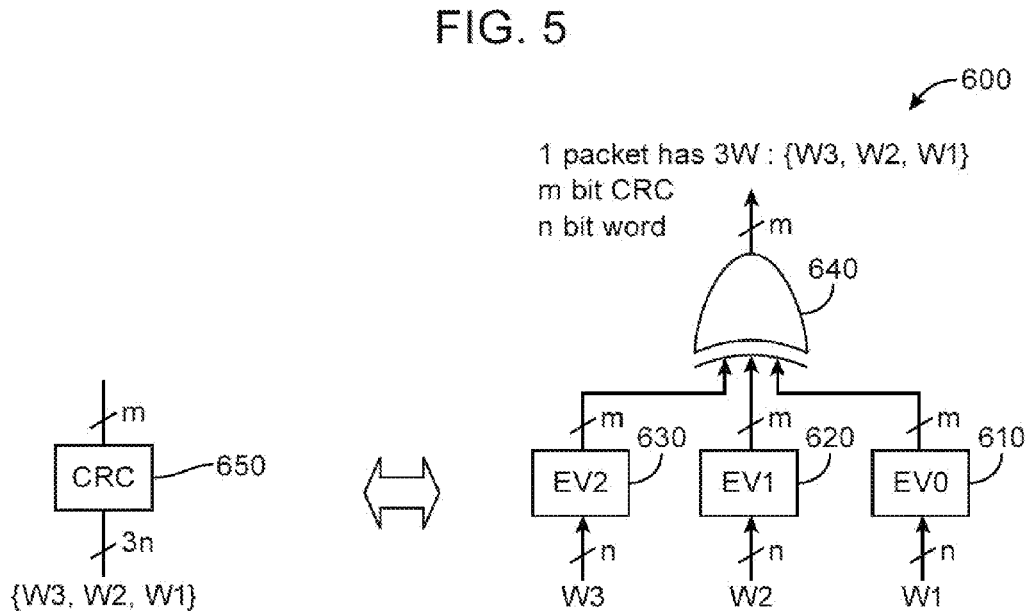
FIG. 6 is a diagram of an illustrative combination of cyclic redundancy checks padded with zeroes in accordance with an embodiment of the present invention.

After pre-computing the contribution of all words in a data packet, the CRC of the data packet may be computed by performing a logic exclusive OR operation over all contributions. An example for such an operation is shown in FIG. 6. In this example, the data packet includes three data words W3, W2, and W1 each being n bits wide with W3 being the start of packet and W1 the end of packet. An m-bit CRC computation of this data packet 650 may be executed by decomposing the CRC computation in two stages. In a first stage, the contributions of each data word may be pre-computed in parallel followed in a second stage by a logic exclusive OR operation performed on the results. In the example, the $0^{th}$ evolution of word W1 610, the first evolution of word W2 620, and the second evolution of word W3 630 are calculated in parallel in the first stage. The results of these three calculations are combined in the second stage by performing an exclusive logic OR operation 640. The use of three words for a data packet in this example is merely illustrative. The data packet may contain any number q of words in which case there would be q operations in the first stage followed by a logic exclusive OR operation combining the results of the q operations of the first stage.

Figure 7:
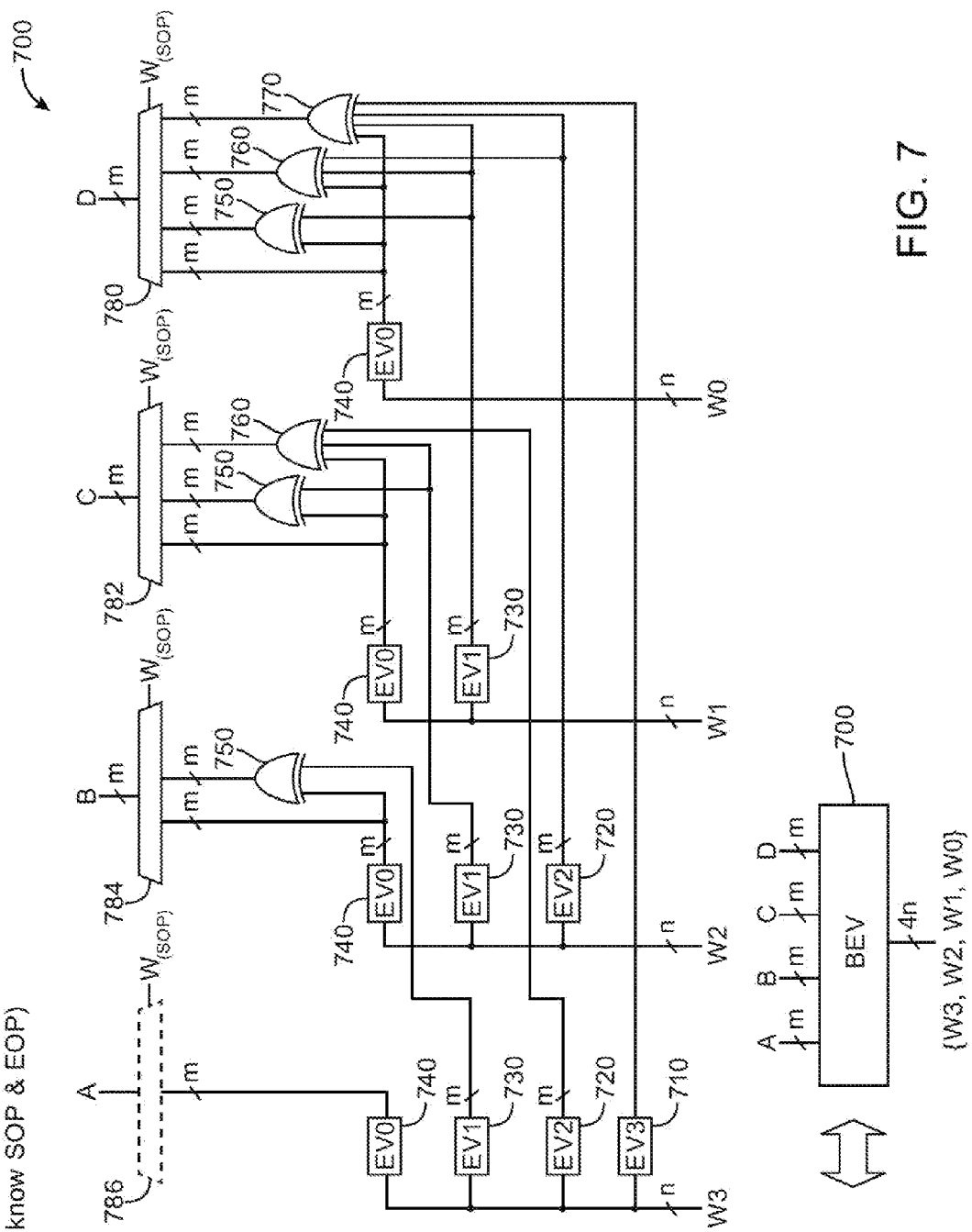
FIG. 7 is an illustrative diagram of a cyclic redundancy check computation circuit in accordance with an embodiment of the present invention.

A cyclic redundancy check (CRC) circuitry that performs cyclic redundancy checks typically has a fixed input data path width (i.e. it can receive a fixed number of words and perform a cyclic redundancy check on the received words in parallel). The problem with receiving the start of packet and the end of packet at different input locations of the CRC circuitry may be addressed by the basic configuration 700 shown in FIG. 7. In this example, the CRC circuitry may receive four words W3, W2, W1, and W0 in parallel. Each word may be n bits wide and each word may be the start of packet (SOP) or the end of packet (EOP). In this scenario, the a first stage may include pre-computing the contribution of each data word to the CRC result as though that word was zero, one, two, or three words from the end of packet, for example, word W3 may be the end of packet in which case W3 is at a distance 0 from the end of packet and the contribution to the CRC result may be obtained by computing the $0^{th}$ evolution 740 of word W3. In this particular case, the start of packet is also the end of packet. Therefore, the pre-computed contribution is equal to the final CRC result A and multiplexer 786 is optional. In the event that the data packet has two words with start of packet (SOP) arriving at word W3 and end of packet (EOP) arriving at word W2, the distance of the word arriving at W3 is at a distance 1 and the distance of the word arriving at W2 at a distance 0 from the end of packet. The contributions to the CRC result may be obtained by computing the $1^{st}$ evolution 730 of word W3 and the $0^{th}$ evolution 740 of word W2. The final CRC result B is computed by selecting the output of the logic exclusive OR gate 750 which combines the two separately computed contributions in multiplexer 784. Similarly, a data packet that spans all four words with start of packet in W3 and end of packet in W0 may have separate contributions for each word pre-computed. The contributions of the different words may be obtained by computing the third evolution 710 of word W3, the second evolution 720 of word W2, the first evolution 730 of word W1, and the $0^{th}$ evolution 740 of word W0. The multiplexer 780 located at the position of the end of packet selects as final CRC result D the output of logic exclusive OR gate 770 which combines the pre-computed contributions of each word.

Increasing the size of the basic configuration 700 by adding an extra word W4 to the fixed length data path may require five additional evolution operations and four additional logic exclusive OR gates. The first logic exclusive OR gate combines the pre-computed contributions of W4 and W3 and feeds into multiplexer 786, the second combines the pre-computed contributions of W4, W3, and W2 and feeds into multiplexer 784, the third combines the pre-computed contributions of W4, W3, W2, and W1 and feeds into multiplexer 782, and the fourth combines the pre-computed contributions of W4, W3, W2, W1, and W0 and feeds into multiplexer 780. Multiplexers 786, 784, 782, and 780 may increase in size as well to accommodate the extra inputs. Increasing the size of the basic configuration 700 also leads to a significant increase in interconnection resources which contributes to the increase in size. Furthermore, the increase in interconnection resources has the undesirable side effect that the length of combinational paths within the CRC circuitry increases significantly which potentially leads to timing closure problems and thereby to an increase in development time. It would therefore be desirable to develop more efficient CRC circuitry, such as for example hierarchical CRC circuitry, especially for wider input data path widths.

Furthermore, the blocks 700 may perform their computation via a processor. In this case, the amount of data to send to each instance of circuit 700 may vary over time based on system issues such as load balancing.

Figure 8:
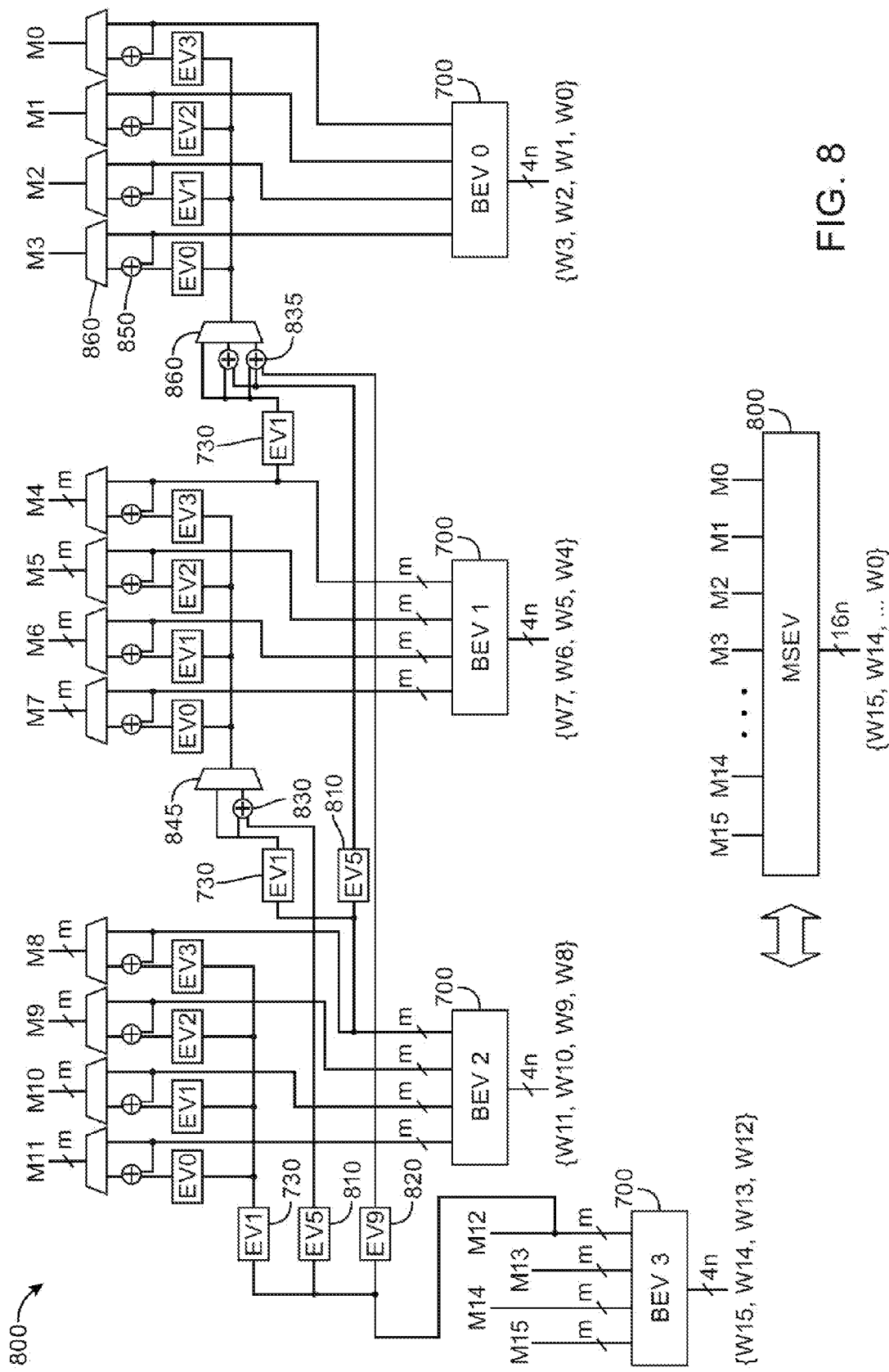
FIG. 8 is a diagram of an illustrative combination of basic cyclic redundancy check computations in accordance with an embodiment of the present invention.

An embodiment of a hierarchical CRC circuitry 800 using basic configurations BEV0, BEV1, BEV2, and BEV3 700 is shown in FIG. 8. The hierarchical CRC circuitry 800 has four basic configurations 700 each having a fixed length data path of four words for a total of 16 words. Each basic configuration may compute a CRC as if start and end of packet is received by the basic configuration. The hierarchical CRC circuitry 800 may have a different number of basic configurations each having different fixed length data paths. For example, hierarchical CRC circuitry 800 may have four basic configurations with a fixed length data path of three words and one configuration with a fixed length data path of four words. The subsequent circuitry may be modified accordingly if the basic configurations have different fixed length data paths. The hierarchical CRC circuitry 800 may also have any different fixed length data path than the 16 words presented in this example. For example, the hierarchical CRC circuitry 800 may have a fixed length data path of 8, 15, 17, 21, 24, or any other number of words that may be appropriate for effectively performing cyclic redundancy checks on incoming data packets.

Consider the scenario where hierarchical CRC circuitry 800 receives a data packet having four or less words and where the start of packet and end of packet are received by the same basic configuration 700. For example, the data packet may have three words with start of packet received by W7 and end of packet received by W5. In this scenario, basic configuration BEV1 700 computes the CRC of the three words and multiplexer 860 selects the output of BEV1 as CRC result M5.

Alternatively, the data packet may still have three words but the start and end of packet are received by different basic configurations. For example, the start of packet may be received by W4 and the end of packet by W2. In this scenario, BEV0 700 may compute the first evolution of W3 and the $0^{th}$ evolution of W2, perform a logic exclusive OR operation of the evolution operations and send the output of this computation to the multiplexer 860 that generates M2. Basic configuration BEV1 700 may compute the $0^{th}$ evolution of W4. Next, the first evolution of the result may be computed by EV1 830 which may be selected by multiplexer 840. Signals that are produced by basic configurations other than the basic configuration that receives the end of packet and that are selected for combination with the CRC computed by the basic configuration that receives the end of packet (e.g., the signal on the output of multiplexer 840) are sometimes also referred to as "carry signals". The carry signal may be sent from multiplexer 840 for another first evolution to EV1. The result of this first evolution, which is sometimes also referred to as an "evolved carry signal", may be combined with the output of BEV0 700 in logic exclusive OR gate 850. The output of this logic exclusive OR gate may be selected by multiplexer 860 as output M2 which constitutes the CRC result of the data packet.

Consider another example in which the data packet has 16 words with start of packet received by W15 and end of packet received by W0. In this example, BEV0 700 may compute a CRC for words W3, W2, W1, and W0 with the result feeding the interconnect that feeds into the multiplexer that outputs M0. Similarly, BEV1 may compute a CRC for words W7, W6, W5, and W4, BEV2 may compute a CRC for words W11, W10, W9, and W8, and BEV3 may compute a CRC for words W15, W14, W13, and W12. In a next step, the ninth evolution of the result delivered by BEV3 820, the fifth evolution of the result delivered by BEV2 810, and the first evolution of the result delivered by BEV1 830 may be computed and the results combined by logic exclusive OR gate 835. The output of the logic exclusive OR operation may be selected by multiplexer 840 to be routed to EV3 where its third evolution may be computed. The result of the third evolution is combined with the output of BEV0 700 in logic exclusive OR gate 850. The result of this operation may be selected by multiplexer 860 as the final CRC result M0 of the 16 word data packet.

Further enhancements to the hierarchical CRC circuitry 800 may be required if the data packet is wider than the fixed length data width (e.g., in the example of FIG. 8 if the data packet has more than 16 words) or if the start of packet and the end of packet are not within the words currently handled by the hierarchical CRC circuitry (e.g., if the start of packet was received at a prior time of if the end of packet will be received at a later time). One solution may be to add an extra level of hierarchy. In this configuration, hierarchical CRC circuitry 800 may be used as a basic building block. This solution may be preferred if the number of words that the fixed length data path may receive at a time increases significantly (e.g., from 16 to 64 or to 256). Depending on the number of words that the fixed length data path may receive at a time, it may be preferable to build several levels of hierarchy using the principles presented in the example of hierarchical CRC circuitry 800 in FIG. 8. An example for such circuitry with hierarchical CRC circuitry 800 as a basic building block is shown in FIG. 9.

Figure 9:
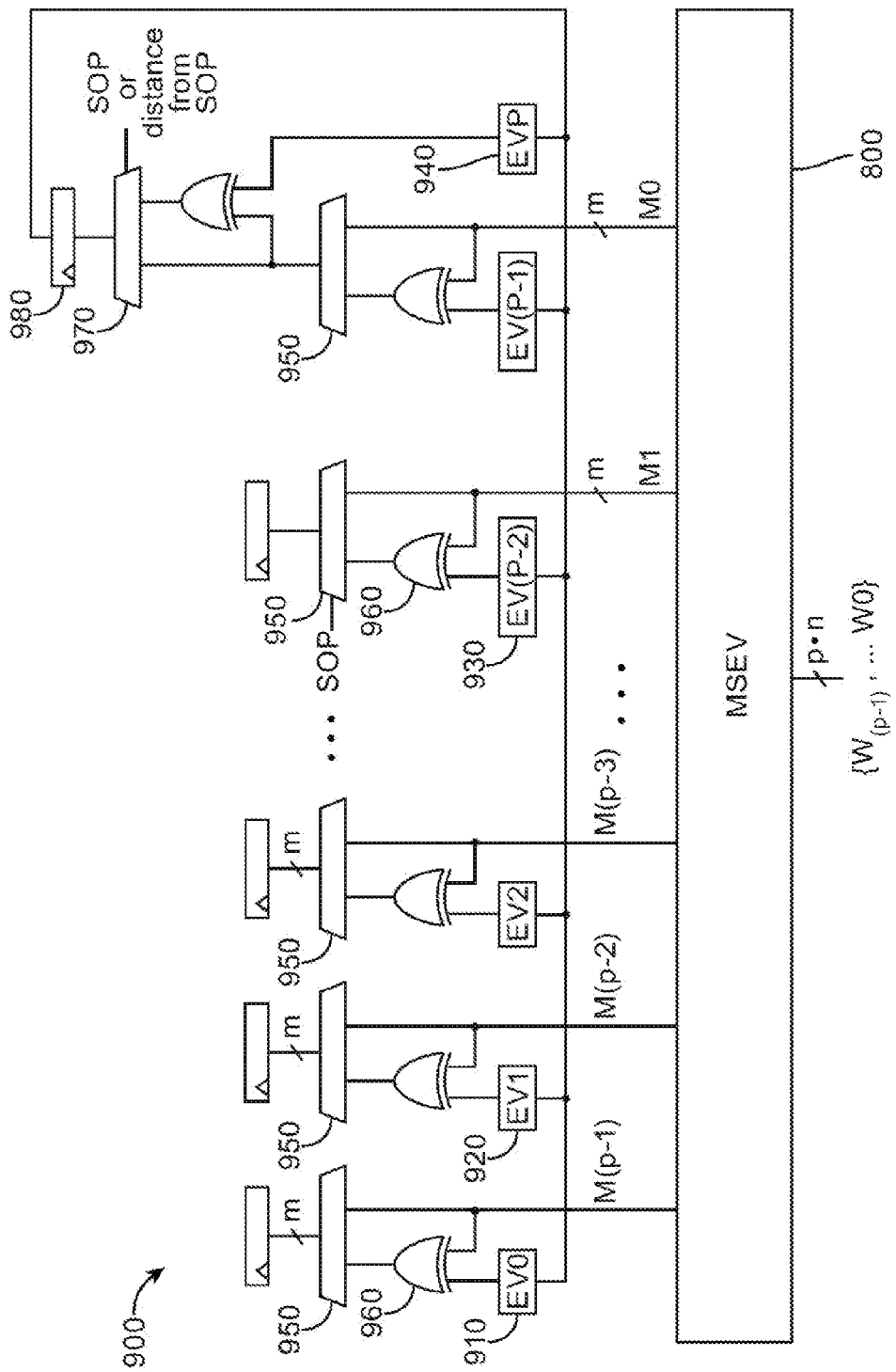
FIG. 9 is a diagram of an illustrative combination of basic cyclic redundancy check computations together with circuitry that enables performing a cyclic redundancy check in multiple iterations in accordance with an embodiment of the present invention.

FIG. 9 shows an m-bit CRC circuitry 900 using hierarchical CRC circuitry 800 with a fixed length data path of p words each word being n bits wide. Additionally, m-bit CRC circuitry 900 may include registers 980 to store the CRC computation results from prior times, multiplexers 950 to select between CRC computations completed in one time step and CRC computations obtained by combining CRC computations from prior time steps with current time steps using logic exclusive OR gates 960 and different evolution operations EV0 910, EV1 920, EV2, ..., EV(p−2) 930 and EV(p−1). The m-bit CRC circuitry 900 may also include an extra evolution operation EVp 940 which may be used if start of packet and end of packet are not received in the current time step and the CRC computation is performed in more than two time steps. In this case, the output of the logic exclusive OR gate may be selected by multiplexer 970 for storage in registers 980. The portion of the m-bit CRC circuitry 900 that is coupled between hierarchical CRC circuitry 800 and the registers and comprises the different evolution operations 910, 920, 930, and 940, the logic exclusive OR gates 960, multiplexers 950 and 970 is sometimes also referred to as a "rollover circuit".

Consider the example in which a data packet having q words with q=p−1 is received with start of packet at position W(p−1) and end of packet at position W1. In this scenario, the hierarchical CRC circuitry 800 may compute the CRC in one time step. The CRC result may leave the hierarchical CRC circuitry 800 as signal M1 which may be selected by multiplexer 950 and stored in registers 980 for further processing.

Consider another example in which a data packet having q words Wq, W(q−1), ..., W1, W0 with q=p−1 is received by CRC circuitry 900 with start of packet received at position W1 at the current time step and end of packet received at position W1 at the next time step. At the current time step, the hierarchical CRC circuitry 800 may compute the CRC of Wq and W(q−1) as signals M0 which may be selected by multiplexers 950 and 970 and stored in registers 980. At the next time step, the hierarchical CRC circuitry 800 may receive the remaining words of the data packet at positions W(p−1), ..., W1 and compute the CRC of these words as signals M1. The CRC result computed at the previous time step and stored in registers 980 may have its (p−2)th evolution computed 930. The result of this computation may be combined with signals M1 in logic exclusive OR gate 960 and multiplexer 950 may select the result of the logic exclusive OR operation as the final CRC result which may be stored in registers.

Consider the scenario in which a data packet having q words Wq, W(q−1), ..., W1, W0 with q=2p+1 is received by CRC circuitry 900 with start of packet received at position W1 at the current time step and end of packet received at position W1 two time steps later. At the current time step, the hierarchical CRC circuitry 800 may compute the CRC of Wq and W(q−1) as signals M0 which may be selected by multiplexers 950 and 970 and stored in registers 980. At the next time step, the hierarchical CRC circuitry 800 may receive the next p words of the data packet at positions W(p−1), ..., W0 and compute the CRC of these words as signals M0. The CRC result computed at the previous time step and stored in registers 980 may have its (p)th evolution computed 940. The result of this computation may be combined with signals M0 in logic exclusive OR gates and multiplexer 980 may select the result of the logic exclusive OR operation. The result of the logic exclusive OR operation may be stored in registers 980. At the subsequent time step, the hierarchical CRC circuitry 800 may receive the remaining words of the data packet at positions W(p−1), ..., W1 and compute the CRC of these words as signals M1. The CRC result computed at the previous time step and stored in registers 980 may have its (p−2)th evolution computed 930. The result of this computation may be combined with signals M1 in logic exclusive OR gate 960 and multiplexer 950 may select the result of the logic exclusive OR operation as the final CRC result which may be stored in registers.

Figure 10:
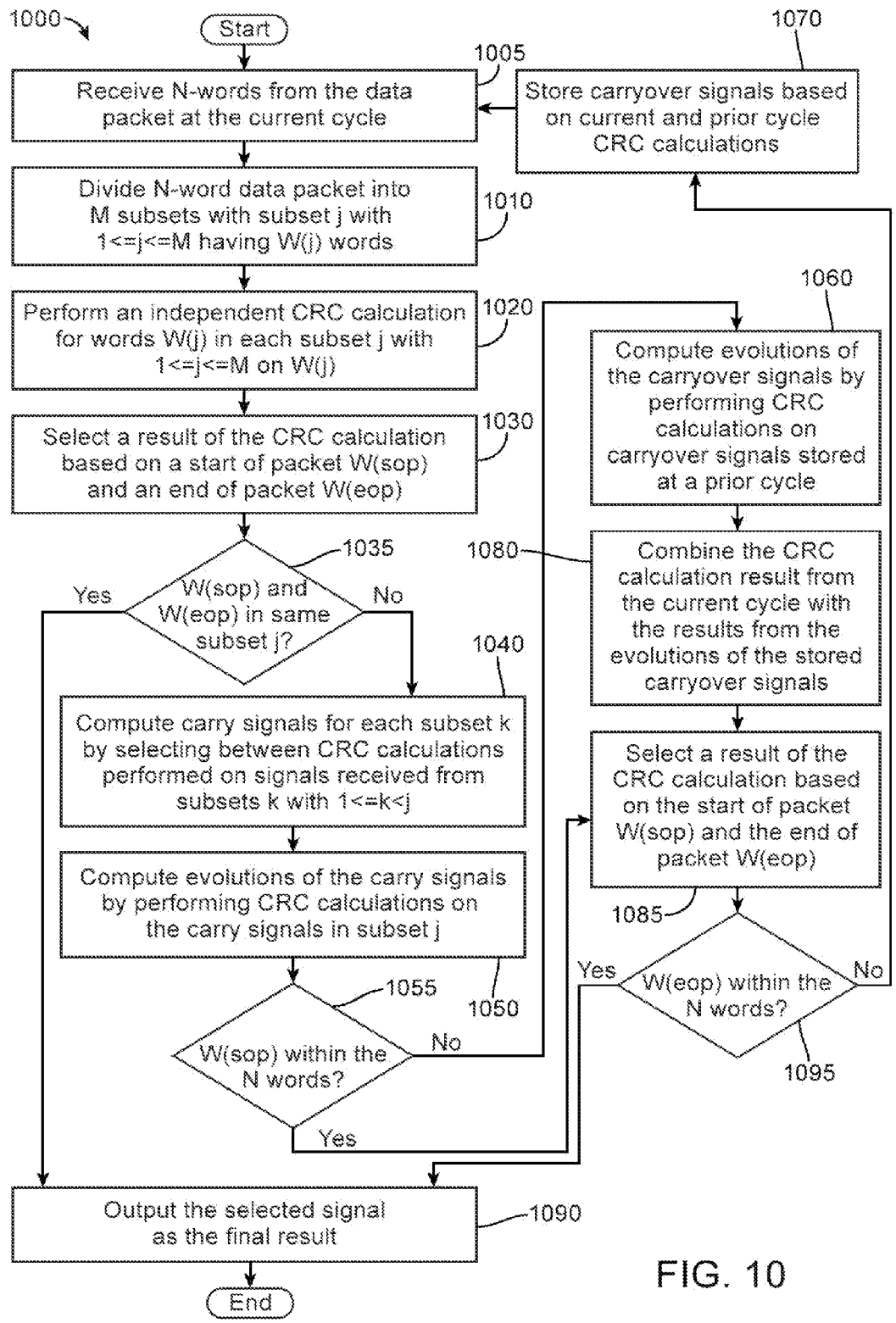
FIG. 10 is a simplified flow chart of illustrative steps for performing a cyclic redundancy check in accordance with an embodiment of the present invention.

A method for receiving a data packet of arbitrary size by a CRC circuitry with fixed length data path N such as for example CRC circuitry 900 is presented in FIG. 10. The portion of the data packet received at the current cycle (step 1005) may be divided into M subsets with subset j, where 1<=j<=M having W(j) words during step 1010. For each subset of words, an independent CRC computation may be performed on the words received during step 1020. This independent CRC computation may be executed in parallel. A result of the CRC computation at the current cycle may be selected based on the position of the start and end of packets during step 1030. If start of packet and end of packet are within the same subset j of words received at a current time step as determined by step 1035, the result computed at the current time step may be output as the final result during step 1090. If start and end of packet are not in the same subset j, a CRC carry signal may be computed for each subset j received during the current cycle by selecting between CRC computations performed on subsets k with 1<=k<j during step 1040. For each subset j, evolutions of the CRC carry signals may be performed during step 1050 and the results may be combined with CRC computations performed for the current subset. During step 1050, the result of this computation may be selected based on the position of the start of packet and the end of packet. If the start of packet is not within the N words received during the current cycle as determined in step 1055, carryover signals have been computed during prior cycles. The next step 1060 may include computing evolutions of the stored carryover signals. The result of this computation may be combined with the CRC calculation result from the current cycle during step 1080. Steps 1060 and 1080 may be skipped if the start of packet is within the N words received at the current cycle. In either case, a result of the CRC calculation may be selected based on the positions of the start of packet and the end of packet during step 1085. During step 1090, the selected signal may be output as the final result if the end of packet is within the N words received at the current cycle 1095. During step 1070, carryover signals based on the current and prior cycle CRC calculations may be stored if the end of packet is not within the N words received at the current cycle, as determined during step 1095. In this case, the next cycle starts with the reception of the next N words of the data packet as illustrated by step 1005.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. Circuitry operable to perform cyclic redundancy check on data received in a first cycle and a second cycle that is subsequent to the first cycle, wherein the data comprises a data packet, and wherein the data packet is bounded by a start of packet and an end of packet, comprising:
    a first plurality of circuits that receives at least a portion of the data packet that is partitioned into a plurality of words, comprising:
        a first circuit in the first plurality of circuits that receives a first subset of the data packet in the first cycle, and that produces first subset cyclic redundancy check bits based on the first subset of the data packet, wherein the first subset of the data packet comprises a first number of words; and
        a second circuit in the first plurality of circuits that receives a second subset of the data packet in the first cycle, and that produces second subset cyclic redundancy check bits based on the second subset of the data packet, wherein the second subset of the data packet comprises a second number of words that is smaller than the first number, wherein the first plurality of circuits produces first cyclic redundancy check bits that comprise at least one of: the first subset cyclic redundancy check bits and the second subset cyclic redundancy check bits, and
    a second plurality of circuits that receives the first cyclic redundancy check bits from the first plurality of circuits, wherein the second plurality of circuits produces second cyclic redundancy check bits based on the first cyclic redundancy check bits.

2. The circuitry defined in claim 1 further comprising:
    a plurality of registers interposed between the first plurality of circuits and the second plurality of circuits.

3. The circuitry defined in claim 2 wherein at least one of the plurality of registers transmits the first cyclic redundancy check bits from the first plurality of circuits to the second plurality of circuits.

4. The circuitry defined in claim 1 wherein at least one circuit in the second plurality of circuits comprises a plurality of multiplexers configured to select from the second cyclic redundancy check bits based on the start of packet.

5. The circuitry defined in claim 4 wherein the at least one circuit in the second plurality of circuits comprises:
    a carry computation circuit that receives the first cyclic redundancy check bits from the at least one circuit of the first plurality of circuits, wherein the carry computation circuit produces third cyclic redundancy check bits based on the received first cyclic redundancy check bits; and
    an additional multiplexer configured to select fourth cyclic redundancy check bits from the third cyclic redundancy check bits based on the start of packet.

6. The circuitry defined in claim 5 wherein the at least one circuit in the second plurality of circuits further comprises:
    an additional circuit that receives the fourth cyclic redundancy check bits from the additional multiplexer, wherein the additional circuit produces fifth cyclic redundancy check bits based on the received fourth cyclic redundancy check bits.

7. The circuitry defined in claim 6, wherein the second subset cyclic redundancy bits comprise second first cyclic redundancy check bits based on the received second subset of the data packet, wherein the at least one circuit in the second plurality of circuits further comprises:
    a plurality of logic exclusive OR gates that receives the fifth cyclic redundancy check bits from the additional circuit and the second first cyclic redundancy check bits produced by the second circuit in the first plurality of circuits, wherein the plurality of logic exclusive OR gates further produces signals based on the fifth cyclic redundancy check bits from the additional circuit and the second first cyclic redundancy check bits produced by the second circuit in the first plurality of circuits.

8. The circuitry defined in claim 7 wherein a multiplexer of the plurality of multiplexers in the at least one circuit in the second plurality of circuits receives the signals produced by the plurality of logic exclusive OR gates and the second first cyclic redundancy check bits produced by the second circuit in the first plurality of circuits, wherein the multiplexer produces signals based on the second first cyclic redundancy check bits produced by the second circuit in the first plurality of circuits when the second subset of the data packet contains the start of packet, and wherein the multiplexer produces signals based on the signals produced by the plurality of logic exclusive OR gates when the at least a portion of the data packet contains the start of packet.

9. The circuitry defined in claim 1 further comprising:
    a rollover circuit that receives the second cyclic redundancy check bits produced by the second plurality of circuits, wherein the rollover circuit produces first additional cyclic redundancy check bits based on the start of packet; and
    a plurality of registers that receives first additional cyclic redundancy check bits from the rollover circuit.

10. The circuitry defined in claim 9 wherein the rollover circuit receives first additional cyclic redundancy check bits from the plurality of registers, the rollover circuit further comprising:
  a given plurality of circuits, wherein at least one circuit produces third cyclic redundancy check bits based on the first additional cyclic redundancy check bits received from the additional plurality of registers.

11. The circuitry defined in claim 10 wherein the rollover circuit further comprises:
  a plurality of logic exclusive OR gates that receives the third cyclic redundancy check bits from the at least one circuit in the given plurality of circuits and the second cyclic redundancy check bits from the second plurality of circuits, and wherein the plurality of logic exclusive OR gates further produces signals based on the third cyclic redundancy check bits from the at least one circuit in the given plurality of circuits and the second cyclic redundancy check bits from the second plurality of circuits.

12. The circuitry defined in claim 11 wherein the rollover circuit further comprises:
  a plurality of multiplexers that receives the signals produced by the plurality of logic exclusive OR gates and the second cyclic redundancy check bits from the second plurality of circuits, wherein the plurality of multiplexers further produces signals by selecting between the second cyclic redundancy check bits from the second plurality of circuits and the signals from the plurality of XOR gates, and wherein the selection is based on the start of packet.

13. The circuitry defined in claim 12 wherein the rollover circuit further comprises:
  an additional plurality of multiplexers that receives the signals produced by the plurality of multiplexers and the signals produced by the plurality of logic exclusive OR gates, wherein the additional plurality of multiplexers is further configured to select between the signals produced by the first plurality of multiplexers and the signals produced by the plurality of logic exclusive OR gates, and wherein the selection is based on the start of packet.

14. A method for operating cyclic redundancy check (CRC) computation circuitry that performs a cyclic redundancy check calculation on a data packet, wherein the data packet comprises a plurality of words and is bounded by a start of packet and an end of packet, the method comprising:
  partitioning the data packet into a plurality of subsets comprising at least first, second, and third subsets that contain respective first, second, and third numbers of words, wherein the third number is greater than the second number, wherein the second number is at least as large as the first number, wherein the first, second, and third subsets share a common word in the data packet, and wherein the first subset of words is not a subset of the third subset of words;
  performing a separate partial cyclic redundancy check calculation for each data packet subset in the plurality of subsets to generate results; and
  computing cyclic redundancy check bits for the data packet by performing cyclic redundancy check calculations using results from some of the separate partial cyclic redundancy check calculations.

15. The method defined in claim 14 further comprising:
  performing cyclic redundancy check calculations using the results of the separate partial cyclic redundancy check calculation to generate carry-candidate signals; and
  selecting carry signals from the carry-candidate signals based on the start of packet.

16. The method defined in claim 15 further comprising:
  performing cyclic redundancy check calculations using the carry signals to generate evolved carry signals;
  performing logic exclusive OR operations using the evolved carry signals and the results of the separate partial cyclic redundancy check calculation; and
  selecting between the results of the logic exclusive OR operations and the results of the separate partial cyclic redundancy check calculation based on the start of packet.

17. The method of claim 14 wherein the cyclic redundancy check (CRC) computation circuitry performs the cyclic redundancy check calculation on a data packet in a plurality of iterations, the method further comprising:
  performing a current separate partial cyclic redundancy check calculation on a portion of the data packet subsets in the plurality of subsets;
  computing current cyclic redundancy check bits for the portion of the data packet subsets by performing cyclic redundancy check calculations using results from each of the current separate partial cyclic redundancy check calculations; and
  storing the current cyclic redundancy check bits.

18. The method of claim 17 further comprising:
  receiving stored current cyclic redundancy check bits;
  performing cyclic redundancy check calculations on the stored current cyclic redundancy check bits to generate evolved cyclic redundancy check signals;
  performing logic exclusive OR operations using the evolved cyclic redundancy check signals and the current cyclic redundancy check bits; and
  selecting between the results of the logic exclusive OR operations and the current cyclic redundancy check bits based on the start of packet.

19. A method for performing a cyclic redundancy check (CRC) calculation on a data packet with multiple data words, wherein the data packet is bounded by a start of packet and an end of packet, the method comprising:
  dividing the multiple data words into groups of data words wherein at least one group of data words in the groups of data words includes more words than another group of data words in the groups of data words, wherein the another group of data words comprises a first data word that is not contained in the at least one group of data words and a second data word that is contained in the at least one group of data words and that is from the data packet;
  generating first CRC results by performing partial cyclic redundancy check calculations on the groups of data words; and
  generating second CRC results by using a plurality of multiplexers to select between the first CRC results based on the start of packet.

20. The method defined in claim 19 wherein the start of packet and the end of packet are in different groups of data words, the method further comprising:
  generating CRC carry-candidate signals by performing cyclic redundancy check calculations on the second CRC results;
  generating CRC carry signals by selecting between the CRC carry-candidate signals based on the start of packet;
  generating evolved CRC carry signals by performing cyclic redundancy check calculations on the CRC carry signals;
  performing logic exclusive OR operations on the evolved CRC carry signals and the second CRC results; and generating CRC results by using a plurality of multiplexers to select between the results of the logic exclusive OR operations and the second CRC results based on the start of packet.

21. The method of claim 20 wherein the cyclic redundancy check calculation is performed in multiple iterations, and wherein the end of packet is in a group of data words that is processed in a different iteration than a current iteration, the method further comprising:

storing the CRC results from the current iteration.

22. The method of claim 21 wherein the start of packet is in a group of data words that is processed in a different iteration than the current iteration, the method further comprising:

receiving stored CRC results;

receiving CRC results from the current iteration;

generating evolved CRC signals by performing cyclic redundancy check calculations on the stored CRC results;

performing logic exclusive OR operations on the evolved CRC signals and the CRC results from the current iteration; and generating output signals by using multiplexers to select between the results of the logic exclusive OR operations and the CRC results from the current iteration.

* * * * *